United States Patent
Makosiej et al.

(10) Patent No.: US 10,748,604 B2
(45) Date of Patent: Aug. 18, 2020

(54) SRAM MEMORY WITH IMPROVED END-OF-READ TRIGGERING

(71) Applicant: COMMISSARIAT A L'ENERGIE ATOMIQUE ET AUX ENERGIES ALTERNATIVES, Paris (FR)

(72) Inventors: Adam Makosiej, Grenoble (FR); Pablo Royer, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/248,832

(22) Filed: Jan. 16, 2019

(65) Prior Publication Data

US 2019/0228820 A1  Jul. 25, 2019

(30) Foreign Application Priority Data

Jan. 24, 2018 (FR) ..................... 18 50542

(51) Int. Cl.
  *G11C 11/41* (2006.01)
  *G11C 11/419* (2006.01)
  *G11C 11/418* (2006.01)
  *G11C 11/412* (2006.01)
  *G11C 7/08* (2006.01)

(52) U.S. Cl.
  CPC .............. *G11C 11/419* (2013.01); *G11C 7/08* (2013.01); *G11C 11/412* (2013.01); *G11C 11/418* (2013.01)

(58) Field of Classification Search
  USPC .................................... 365/156, 154, 189.15
  See application file for complete search history.

(56) References Cited

U.S. PATENT DOCUMENTS

| | | | |
|---|---|---|---|
| 5,828,612 A | * | 10/1998 | Yu ............................ G11C 7/12 365/203 |
| 9,858,988 B1 | | 1/2018 | Ghosh et al. |
| 2006/0083091 A1 | | 4/2006 | Edahiro |

(Continued)

FOREIGN PATENT DOCUMENTS

JP    2007-220259    8/2007

OTHER PUBLICATIONS

U.S. Appl. No. 15/916,585, filed Mar. 9, 2018, US 2018/0268890 A1, Gupta, N., et al.

(Continued)

*Primary Examiner* — Tan T. Nguyen
(74) *Attorney, Agent, or Firm* — Oblon, McClelland, Maier & Neustadt, L.L.P.

(57) ABSTRACT

Circuit for triggering the end of a read operation, for a SRAM memory device, comprising:
 a plurality of pairs of transistors connected to a bit line and an additional bit line, the transistors each having a source connected to a node, the node and the bit lines being, prior to the activation of said given word line, respectively pre-charged via the pre-charging means, then, when said word line is activated, at least the bit lines are disconnected from the pre-charging means, in such a way as to modify the conduction state of certain transistors and consequently cause a variation in the potential of said node until reaching a determined threshold potential that triggers the emission of an end-of-phase signal.

19 Claims, 2 Drawing Sheets

(56) References Cited

U.S. PATENT DOCUMENTS

| | | | | |
|---|---|---|---|---|
| 2010/0202221 A1* | 8/2010 | Gupta | ............ | G11C 7/12 365/189.15 |
| 2012/0127782 A1* | 5/2012 | Moriwaki | ............ | G11C 7/18 365/154 |
| 2016/0027503 A1* | 1/2016 | Anvar | ............ | G06F 13/4086 365/154 |

OTHER PUBLICATIONS

U.S. Appl. No. 16/083,314, filed Mar. 13, 2017, Makosiej, A., et al.

French Preliminary Search Report dated Sep. 28, 2018 in French Application 1850542, filed Jan. 24, 2018 (with English Translation of Categories of Cited Documents).

Ishibashi, K. et al. "Low Power and Reliable SRAM Memory Cell and Array Design", Springer Series in Advanced Micro-electronics, 2011, 4 Pages.

\* cited by examiner

SRAM MEMORY WITH IMPROVED END-OF-READ TRIGGERING

TECHNICAL FIELD AND PRIOR ART

This invention relates to the field of SRAM type memories (SRAM for "Static Random Access Memory"), and in particular relates to that of the management of the read operations.

This invention implements a circuit that makes it possible to generate a signal that indicates the end of a particular phase of a read operation and is adapted very particularly to devices that operate on a low voltage or in which a supply voltage scaling is implemented during the various operating phases of the memory.

In SRAM memories, an optimum synchronisation of the various phases of a read operation is particularly important both for providing a high speed and reduced access time while still avoiding read errors, in particular in the presence of time and space variations from one location to another of the memory.

Figure 1:
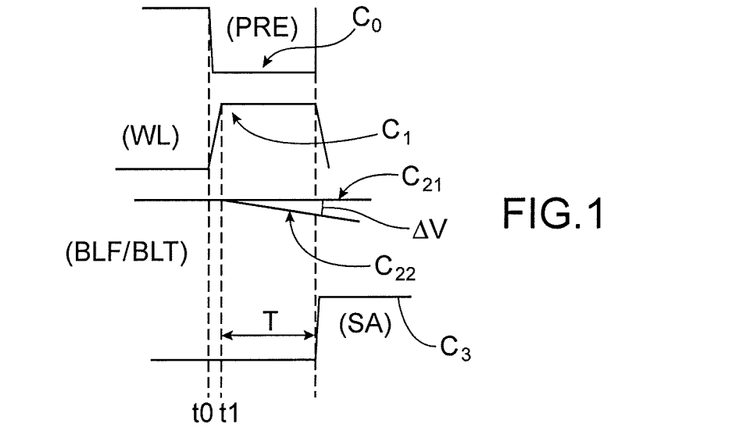
FIG. 1 shows, via a chronogram, various phases during a read operation carried out in a SRAM memory.

FIG. 1 shows, through the example of a chronogram, a sequence of various phases of a read operation in a conventional SRAM memory. It is assumed here that the signals are active at the high state.

The bit lines are typically pre-charged at the same potential, for example a supply potential VDD via pre-charging circuits.

In a first time $t_0$, the pre-charge (change in state of the curve $C_0$) of the bit lines is deactivated, then, a given word line is activated (change in state of the curve $C_1$), which makes it possible to select a line of cells and to access the information storage nodes.

According to the logic information stored, one of the lines among a bit line and an additional bit line is discharged (decreasing curve $C_{22}$) and then a given duration T is allowed to pass so that a sufficient difference in voltage $\Delta V$ is established between the bit line and the additional bit line, so that this difference in voltage can be transformed by a sense amplifier into a signal that represents logic information stored in a cell. After this particular phase of duration T the sense amplifier is activated (change in state of the curve $C_3$). The end of the read operation (change in state of the curve $C_1$) being characterized by a deactivating of the given word line.

The duration T of the phase between the activation instant of the word line and the activation instant of the sense amplifier can vary, according to the temperature, the location of the cell that is accessed for a read due to variations in the method of manufacturing resulting in different capacitances for example from one bit line to another, as well as during the service life of the memory. Moreover, it varies according to the potentials implemented in particular pre-charge potentials.

An optimisation of this duration T is required. If the sense amplifier is triggered too early, there is a risk of a read error of the stored information but a triggering that is too late leads to increasing the access time and generating unnecessary consumption.

This optimisation is difficult to implement all the more so that for standard SRAM memory devices, generally a high output is sought that can be of $6\sigma$ ($\sigma$ being a standard deviation) and correspond approximately to 2 defective cells out of a billion.

The document "Low Power and Reliable SRAM Memory Cell and Array Design", by Ishibashi et al, Springer Series in Advanced Micro-electronics, 2011 presents an example SRAM device wherein the end of a read operation depends on the time required for the discharging of a dummy bit line connected to a column of dummy cells added at the periphery of the array plane containing all of the memorisation cells.

This solution is effective in that in particular when it takes account of the characteristics of dummy cells which have a configuration and therefore a behaviour that is similar to that of memorisation cells of the memory plane. This solution however tends to increase the global space of the memory device.

Moreover, optimising the aforementioned duration T is more arduous for devices that operate on low voltage, or wherein an adjustment in the supply voltage is implemented.

Indeed, for such devices, this duration can vary substantially according to whether in the case of a bit line average discharge time or in the worst case corresponding to the criterion $6\sigma$.

It is therefore sought to produce a new SRAM memory device that is improved with respect to the disadvantages mentioned hereinabove.

DISCLOSURE OF THE INVENTION

According to an embodiment, this invention relates to a static random access memory device comprising:

an array plane provided with at least one array of SRAM memory cells, said array being associated with a plurality of pairs of bit lines and with a plurality of word lines, the device further being provided with a circuit for triggering the end of the read operation, configured to emit a signal $S_{eor}$ for triggering the end of a read operation indicating the end of a given phase of a read operation carried out on the memory, with this given phase being itself triggered by an activating, during a read operation, of a given word line among said word lines, said circuit for triggering the end of the read operation comprising:

a plurality of pairs of transistors, each pair of transistors comprising a first transistor of which the gate is connected to a first bit line and a second transistor of which the gate is connected to a second bit line, complementary to the first bit line, the transistors of said pairs with each one having a source connected to a node, said node on the one hand and said first and second bit lines on the other hand being, prior to the activation of said given word line, respectively pre-charged in such a way that the first transistor and the second transistors are in a given conduction state, then, when said word line is activated, said first and second bit lines are disconnected from the pre-charging means, in such a way as to modify the conduction state of certain transistors of said pairs of transistors and consequently cause a variation in the potential of said node until reaching a determined threshold potential that triggers the emission of said signal for the end of the read operation.

The emission of this end-of-operation signal is able to trigger an activation of at least one sense amplifier (SA) which then samples a difference in potential between the first bit line and the second bit line.

The term conduction state means an on or off state. An embodiment provides that the pairs of transistors are pre-charged in such a way that the transistors are all off before the activation of the word line, then, after this word line progressively, certain transistors, of the triggering circuit become on.

The triggering of the end-of-read implemented using such a circuit takes account of a statistical average of the states of all of the bit lines and makes it possible to cover the worst cases of discharging time that corresponding to the criterion 6σ.

The first transistor and the second transistor are more preferably of the same type and of identical design. The term transistors "of the same type" here means the type of conductivity, the first transistor and the second transistor able to be for example both of the PMOS type.

The term transistors "of identical design" means that the transistors are produced identically with the same design, the same method of manufacture and the same geometry.

According to a possible embodiment, in particular when prior to the activation of said given word line the bit lines are set to a supply potential VDD, in other words "pre-charged" at the supply potential VDD, the first transistor and the second transistor can be of the PMOS type. In this case, prior to the activation of said given word line, said node of the detection circuit is typically set (in other words "pre-charged") at a reference potential (in other words ground potential) GND.

The node can also be connected to a circuit portion adapted to slow down the variation in potential of said node.

This circuit portion can comprise a metal line and/or at least one capacitor. The charging or discharging time of the node depend on the capacitance of this metal line or of the capacitor and consequently the speed at which the potential of this node varies before reaching the threshold potential value.

This circuit portion can also be provided with one or several transistors of the type of conductivity opposite that of the first transistor and of the second transistor, with the other transistors being in particular of the NMOS type when the first and the second transistors are of the PMOS type. In the way in which these other transistors are configured, and in particular their dimensions, depend the charging or discharging time of the node.

This circuit portion can be provided with an additional pre-charging element comprising at least one transistor, the pre-charging element being configured to apply to the node a pre-charge potential so as to pre-charge the node prior to said activating of said given word line.

According to a possibility of implementing the device, the node can also be connected to a circuit element configured to emit the triggering signal when the given potential exceeds the threshold potential. This circuit element can be for example in the form of an inverter or a comparator configured to compare said given potential with a reference potential.

According to a possibility of implementing the device, an output of the triggering circuit can advantageously be connected to a control circuit adapted to emit an activation signal of said sense amplifier consecutive to the receiving of said end-of-reading triggering signal.

According to a possibility of implementing the device, an output of the triggering circuit can be connected to a line decoder configured to emit a word line deactivation signal consecutive to the receiving of said end-of-reading triggering signal.

According to a particular embodiment wherein said first and second bit lines are local bit lines shared by cells of said array, the memory plane comprises at least one other SRAM cell array, the device can be provided furthermore with another triggering circuit of the end of the read operation, configured to emit another signal for triggering the end of the read operation, said other triggering circuit being connected to other pairs of local bit lines shared by SRAM cells of said other array. In this case, a multiplexer can be arranged at the output of said triggering circuit of the end of the read operation and of said other triggering circuit of the end of the read operation.

Advantageously, a triggering circuit such as implemented according to the invention applies particularly well to a device wherein the SRAM memory cells are supplied by a low supply potential VDD.

The term "low supply potential" or "low voltage" means here and in all of the description, a voltage that is less than half a nominal operating voltage which is generally established for a given technology and therefore depends on the technology, and in particular on the ITRS technological node of the design of the memory. For example for an SRAM memory device implemented in an ITRS technological node (for "International Technology Roadmap for Semiconductors") less than 32 nm it is considered for example that a low voltage is less than 0.6V.

Advantageously, the triggering circuit also applies particularly well to a device wherein the supply potential VDD is scalable according to the type of operating mode (in particular read, write or retention) wherein the memory is.

According to an aspect, this invention provide a method of configuring a device such as defined hereinabove and wherein the transistors of said pairs of transistors have a channel region provided in a biased body bias according to a given substrate biasing, the method comprising, after producing said triggering circuit steps consisting in:
carrying out a read operation on said memory array then,
measuring the duration of said given phase during this read operation,
scaling the given substrate biasing according to said measured duration.

BRIEF DESCRIPTION OF THE DRAWINGS

This invention shall be better understood when reading the description of embodiments, given solely for the purposes of information and in a non-limiting manner, in reference to the accompanying drawings wherein.

Identical, similar or equivalent portions of the various figures bear the same numerical references in order to facilitate passing from one figure to another.

The various portions shown in the figures are not necessarily shown to a uniform scale, in order to make the figures more legible.

DETAILED DESCRIPTION OF PARTICULAR EMBODIMENTS

Figure 2:
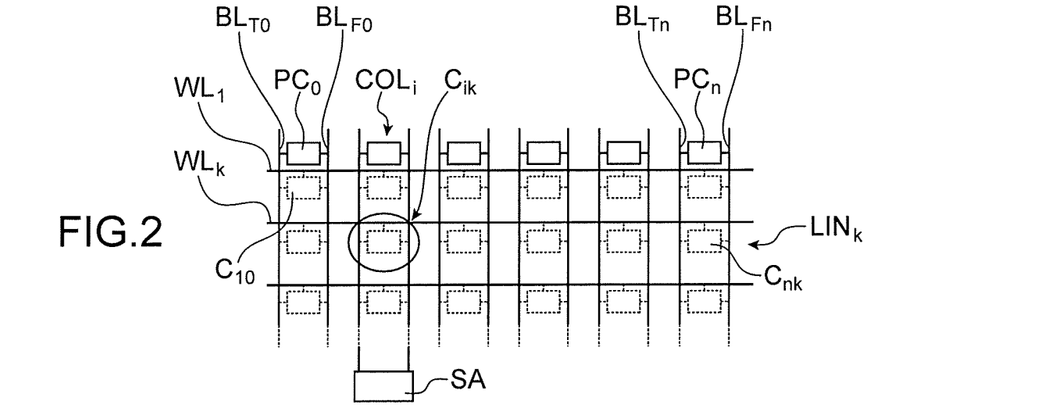
FIG. 2, shows a conventional arrangement example of an array of SRAM memory cells with associated pre-charging circuits.

A circuit for triggering the end of the read operation such as implemented according to the invention is integrated into a SRAM memory device provided with an array plane comprising at least one memory array, for example such as shown in FIG. 2, formed from a plurality of lines and columns of SRAM memory cells.

The triggering circuit can be implemented without any modification of the internal structure of the SRAM cells $C_{10}$, ... $C_{ik}$, ..., $C_{nk}$ and requires the implementation of only a limited number of additional elements peripheral to the memory plane.

Figure 3:
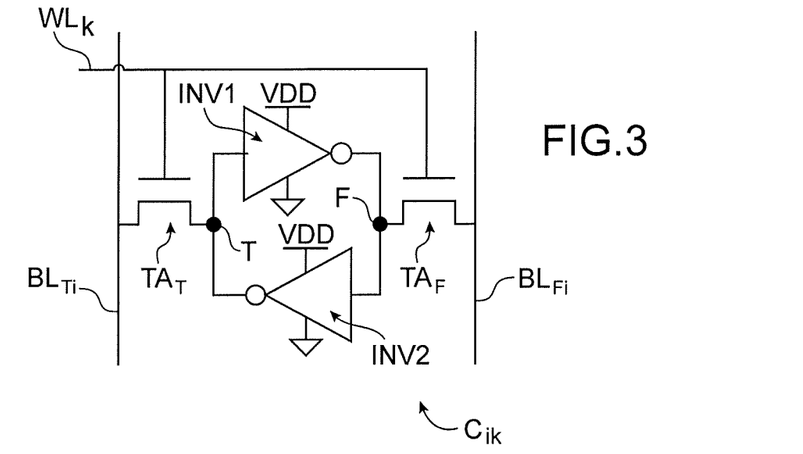
FIG. 3 shows an example of a conventional static random access memory, able to be integrated into a SRAM device according to the invention.

The cells of the memory device can have a conventional arrangement as shown in FIG. 3.

The cell $C_{ik}$ shown is provided with two storage nodes T and F, provided to store a first piece of logic information, and a piece of logic information complementary to the first piece of information. The maintaining of the logic information in the nodes T, F is provided by transistors that form inverters INV1, INV2 that loop on themselves. For example, when the SRAM cell is of the type commonly called "6T" and thus formed from 6 transistors, the two inverters INV1, INV2, are typically carried out by two charge transistors, for example of the PMOS type and two conduction transistors for example of the NMOS type. The inverters INV1, INV2 are in this example supplied by a supply potential VDD, which may be scaled during the various operating phases, in particular the read, write operations, and retention phase of the memory device.

The triggering circuit implemented according to the invention is particularly applied to supply voltage scaling memory device and to low supply voltage memories VDD, in other words less than half of a nominal operating voltage.

The access to the storage nodes T and F is carried out through two access transistors $TA_T$ and $TA_F$ connected respectively to a first bit line $BL_{Ti}$, and a second bit line $BL_{Fi}$, complementary, shared by cells of the same column $COL_i$ of cells.

Pre-charging circuits $PC_0$, $PC_n$ having for role to pre-charge the bit lines $BL_{Ti}$, and $BL_{Fi}$, at the same given value of potential, for example the supply potential VDD are associated with each column. The pre-charging circuits $PC_0$, $PC_n$ are typically arranged at the end of a column opposite that where there is a sense amplifier SA that receives a difference in potentials between the bit line and the complementary bit line to the cell which is accessed for reading and converts this difference in potentials into a signal corresponding to a logic level.

Access to the storage nodes T and F is allowed when a word line $WL_k$ connected to the access transistors $TA_T$ and $TA_F$ and shared by the SRAM cell or cells of the same line of cells of the array is activated.

The access transistors $TA_T$ and $TA_F$ are thus provided to make it possible to access or block the access respectively to the first node T and to the second node F. A read operation on the cell $C_{ik}$ is triggered when the word line $WL_k$ is activated, in other words a signal emitted on the latter makes it possible to access the information storage nodes of the cells associated with this word line $WL_k$. The pre-charging of the bit lines is deactivated prior to the activation of the given word line $WL_k$.

Then, once the word line $WL_k$ is activated, a phase of the read operation consists in waiting for a line among the bit line BLTi and the complementary bit line BLFi to discharge.

The duration of this discharge before a sense amplifier SA is activated is regulated by the intermediary of the triggering circuit of the end-of-read operation mentioned hereinabove and such as implemented according to the invention.

Figure 4:
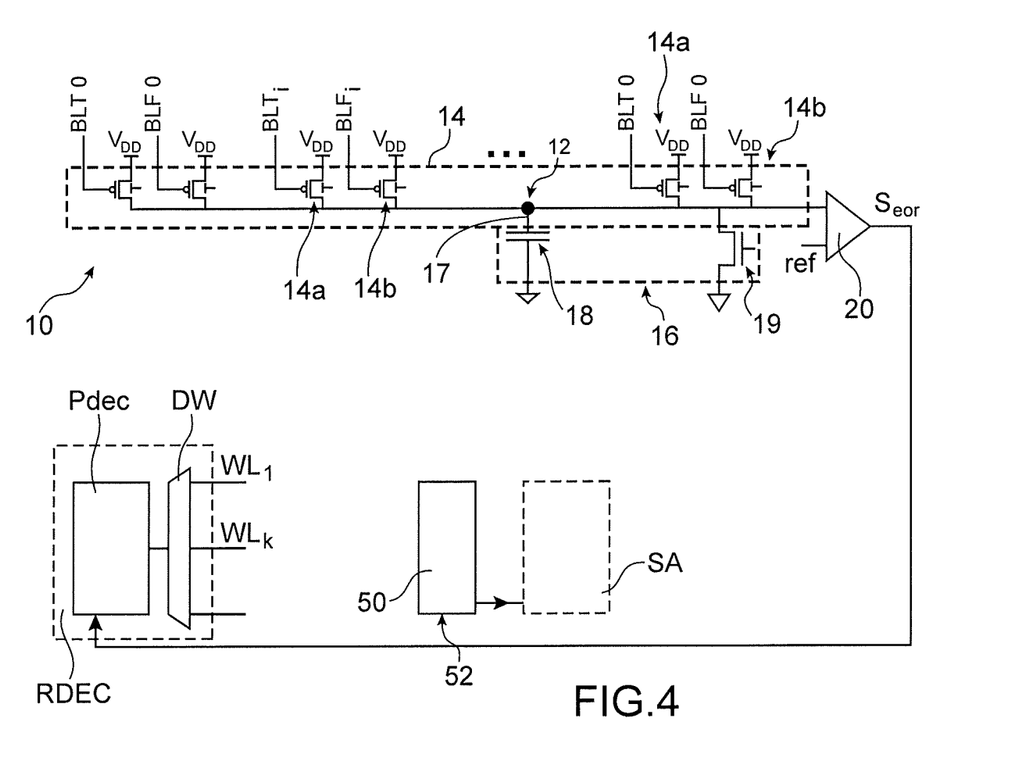
FIG. 4, shows an example of an end-of-read triggering circuit in order to end a given read operation phase corresponding to the time required for the difference in potential between a bit line and an additional bit line, both pre-charged at the same potential, to reach a determined threshold that is sufficient to make it possible to be able to activate a sense amplifier designed to convert this difference in voltage into a logic level that represents a piece of logic information contained in a cell and which is accessed during a read operation.

An embodiment of such a circuit 10 is shown in FIG. 4.

The triggering circuit 10 is configured to generate a signal $S_{eor}$ that indicates the end of the aforementioned given phase also called "end-of-read triggering signal". The triggering circuit 10 is configured to make it possible to generate this end-of-read triggering signal $S_{eor}$ according to a sort of statistical average of the difference in voltage of the pairs of bit lines BLTi, BLFi of the array.

This triggering circuit 10 is provided with a first circuit portion 14 connected to a node 12 of which the electrical potential is able, when it reaches a predetermined threshold value, to trigger the emission of the end-of-read triggering signal $S_{eor}$.

The first circuit portion 14 comprises a plurality of pairs of transistors 14a, 14b with each pair being connected to a pair of bit lines among the set of bit lines and complementary bit lines of the array.

The transistors 14a, 14b, are of the same type and preferably of identical design. In the particular embodiment shown, the transistors 14a, 14b are of the PMOS type. Each pair of transistors comprises a first transistor 14a of which the gate is connected to a bit line BLTi among the bit lines BLT0, BLTn of the array of cells and able to be connected to the first respective node T of the cells of this array.

Each pair of transistors also comprises a second given transistor 14b of which the gate is connected to a complementary bit line BLFi among the complementary bit lines BLF0, BLFn, of the cell array able to be connected to the second respective node F of the cells of this array.

The transistors 14a, 14b have a source electrode connected to the node 12.

In the embodiment shown, the transistors 14a, 14b also have a drain connected to a biasing potential here corresponding to the supply potential VDD.

The node 12 can also be connected to a second circuit portion 16 that, in the embodiment shown, is provided with at least one capacitor 18 or with a conducting line 17 with a predetermined capacitor 18.

At the beginning of the read operation, the bit lines BLT0, BLTn, BLF0, BLFn are all pre-charged at the same given potential through the pre-charging circuits $PC_0$, . . . , PCn. In this embodiment, a pre-charging of the bit lines BLT0, BLTn, BLF0, BLFn is provided by applying to all of them for example a supply potential VDD.

At the same time, at the beginning of the read operation, the node 12 is also pre-charged at a second potential, in this example a ground potential GND. An additional pre-charging element connected to the node 12 can thus be provided to apply this second potential. In the embodiment shown, the pre-charging element belongs to the second circuit portion 16 connected to the node 12 and comprises at least one transistor 19, for example of the NMOS type.

The conditions for pre-charging and potentials applied to the transistors 14a, 14b and to the node 12 to which these transistors 14a, 14b are connected are such that in the configuration example, before activation of a word line $WL_k$, making it possible to select a line of cells, the transistors 14a, 14b are all in an off operating state. As the bit lines BLT0, BLTn, BLF0, BLFn are all placed at the same potential, the conduction state of the transistors 14a, 14b is identical and in this example such that there is no flow of current between the first circuit portion 14 formed by the transistors 14a, 14b and the second portion 16 also connected to the node 12.

Then, when said word line $WL_k$ is activated, the bit lines BLT0, BLTn, BLF0, BLFn are disconnected from the pre-charging circuits. The node 12 can also be disconnected from its associated pre-charging element and allowed to float. The same pre-charging signal is advantageously used to carry out the pre-charging of the node 12 and that of the bit lines BLT0, BLTn, BLF0, BLFn.

The disconnecting of the pre-charges and the activation of the word line $WL_k$ thus makes it possible to made the source gate voltage of the transistors 14a, 14b, depending in particular on the logic levels stored in the nodes of the cells selected by this activation and to cause a modification in the conduction state of certain transistors of the first circuit portion 14. This modification can be produced successively from one transistor to another, according to the differences in the capacitances of the bit lines with which the transistors 14a, 14b are respectively associated and the differences related to the methods of manufacture between the cells which are read in the array.

The modification in the conduction state of certain transistors, among said plurality of pairs of transistors thus consequently results in a variation of the potential of the node 12.

The speed at which this potential varies depends in particular on the parameters of the second circuit portion 16, and in particular on the capacitance of the conducting line 17. The second circuit portion 16 thus makes it possible to slow down a discharge of the node 12 according to a delay that can be adjusted, in particular according to the capacitance of the conducting line 17 itself depending on the dimensions that are provided for this conducting line 17 typically formed from metal.

The second circuit portion 16 can also be provided with one or several transistors of the type opposite that of the transistors 14a, 14b, and of which the sizing also makes it possible to adapt the speed at which the potential of the node 12 varies. Thus, when the transistors 14a, 14b connected to the bit lines, are of the PMOS type, a second circuit portion 16 is more preferably provided with one or several transistors of the NMOS type.

In the particular embodiment shown with the type of pre-charging that has just been described, the second circuit portion 16 therefore tends to draw downwards the potential at the node 12 while this potential tends to be driven upwards by the putting into conduction of transistors 14a, 14b of the first circuit portion 14.

When the potential of the node 12 reaches a predetermined threshold potential, the emission of an end-of-phase signal $S_{eor}$ is triggered, for example using an inverter or as in the example shown, a comparator 20 that has an input connected to the node 12 which is compared to another input placed for example at a reference potential Vref.

The emission of the end-of-read triggering signal $S_{eor}$ makes it possible to activate a sense amplifier SA, which receives a difference in voltage between the two bit lines of the cell that is accessed for reading and converts this difference in voltage into a signal corresponding to a piece of logic information stored in the memory of the cell which is read.

The activation of the sense amplifier SA can be carried out for example by the intermediary of a sense amplifier activation signal SA_EN emitted by a control circuit 50 when it receives the end-of-read triggering signal $S_{eor}$.

The emission of the end-of-read signal $S_{eor}$ also makes it possible to trigger a deactivating, by the intermediary of a line decoder RDEC, of the word line $WL_k$ that has just been activated in order to carry out the read. Thus, the end-of-read triggering signal $S_{eor}$ can be emitted to a line decoder RDEC typically formed from a pre-decoding stage Pdec and from a word line pilot stage DW. The total duration of the read operation depends also on a circuit loop 52 that connects the output of the triggering circuit 10 to the means for activating the sense amplifier and to the means of deactivating the word line. The delay introduced by this loop 52 can be adjusted, but this adjustment is not the object of this application.

As indicated hereinabove, the duration T_eor of the phase described hereinabove resulting in the emission of the end-of-read triggering signal $S_{eor}$ depends on the speed at which the potential of the node 12 varies starting from the moment when the word line is activated.

A way of adjusting this duration T_eor is to adapt the size of the transistors 14a, 14b of the first portion 14 of circuit 10. These transistors 14a, 14b are provided, during the designing of the memory device, with dimensions, in particular a W/L ratio of the channel width over their channel length that is sufficiently substantial to make it possible to minimise the effects due to the random variations within the memory array and sufficiently low to be able to limit the size of the triggering circuit 10.

In order to be able to scale the duration T_eor of the phase between the activation of the word line and the activation of the sense amplifier, an adaptation of the threshold voltage of the transistors 14a, 14b can also be implemented during the designing of the memory device. Transistors 14a, 14b with low threshold voltages are more preferably chosen, for example less than 300 mV when the supply voltage is for example about 1V.

As suggested hereinabove, the duration T_eor can also depend on the second circuit portion 16, and in particular on the capacitance of the conducting line 17, itself depending on the dimensions of this line 17, or on the capacitance of at least one capacitor connected to this line 17.

As suggested hereinabove, in a case where the second circuit portion 16 connected to the node 12 comprises one or several transistors, for example of the NMOS type when the transistors 14a, 14b are of the PMOS type, an adjustment of the size of NMOS transistors of the second circuit portion 16 also makes it possible to scale the duration T_eor of the phase preceding the triggering of the end of the reading. According to a particular embodiment, when the first portion 14 is carried out with PMOS transistors and a pre-charging such as described hereinabove, the second portion 16 can be carried out with one or several resistive NMOS transistors i.e. with a low W/L ratio.

In a triggering circuit 10 such as described hereinabove it is also possible to provide to adjust the biasing of the body bias wherein the channel region of the transistors 14a, 14b is according to the biasing voltage level VDD used for biasing the cells of the SRAM memory array.

As this adjustment has for consequence to adapt the threshold voltage of the transistors 14a, 14b, it also makes it possible to scale the duration T_eor of the read operation phase described hereinabove and leading to the emission of the signal Seor for triggering the end of the read.

Such an adjustment of the biasing of the body bias and adaptation of the threshold voltage of the transistors 14a, 14b can be carried out once these transistors 14a, 14b have been manufactured. Thus, after the manufacture of the SRAM memory device and of the triggering circuit 10, it is possible to carry out a read operation test then, according to the duration of the aforementioned phase during this test, to then configure the biasing of the body bias in such a way as to reduce the duration of this phase or to increase the duration of this phase.

In the particular embodiment of FIG. 4, an increase in the biasing of the body-bias leads to an increase in the threshold voltage of the transistors 14a, 14b which increases the duration of the phase preceding the emission of the signal Seor, while a decrease in the body-bias leads to a drop in the threshold voltage of the transistors 14a, 14b which decreases the duration of the phase preceding the emission of the signal Seor.

According to an alternative embodiment of that shown for which the transistors 14a, 14b are replaced with transistors of the NMOS type pre-charged at the ground potential, an increase in the body-bias leads to a drop in the threshold voltage of the transistors 14a, 14b which decreases the duration of the phase preceding the emission of the signal Seor.

The implementing of a detection of the end of the reading presented hereinabove in connection with FIG. 4 is advantageously carried out with a first circuit portion 14 provided with transistors 14a, 14b of the PMOS type connected to the bit lines in that it is particularly adapted to a pre-charging of bit lines carried out at a supply voltage VDD and such as typically provided for in SRAM devices.

The implementing of a detection circuit of the type of that described hereinabove with transistors 14a, 14b PMOS is however not reserved solely for a pre-charging of the bit lines at the supply potential VDD.

Another alternative embodiment can provide bit lines BLT0, BLTn, ..., BLF0, BLFn initially set to a ground or reference potential GND before a word line is activated. In this case, the node 12 is initially placed at a potential, for example of a supply potential equal to VDD, in such a way that before activation of the word line, all of the transistors 14a, 14b are in an on state. Then when a word line is activated, certain transistors among the pairs of transistors 14a, 14b become progressively off. In this case, it is possible to detect when the node 12 passes above a threshold value triggering the emission of the signal Seor that makes it possible to activate a sense amplifier and a deactivating of the word line.

A circuit 10 can alternatively be provided comprising a first portion 14 provided with transistors 14a, 14b of the NMOS type, in particular if it is desired to implement a pre-charging of the bit lines BLT0, BLTn BLF0, BLFn at a ground or reference potential GND. The node 12 can be in this case pre-charged at the supply potential VDD. The second circuit portion 16 can be provided with one or several transistors of a type opposite that of the transistors 14a, 14b, in particular one or several PMOS transistors when the transistors 14a, 14b, are of the NMOS type. This makes it possible to counterbalance the variation in potential at the node 12 once the word line is activated. In this embodiment, the second circuit portion 16 therefore tends to draw upwards the potential at the node 12 while this potential tends to be driven downwards by the first circuit portion 14.

Thus, after activation of the word line, the potential of the node 12 tends to drop until reaching a threshold value that triggers the emission of the signal Seor.

Detecting the passing below the threshold value can be done using a circuit of the inverter or comparator type that has a programmable reference voltage.

Implementing the first portion 14 of the detection circuit 10 with NMOS transistors is not reserved solely for the pre-charging of bit lines at the reference potential GND.

Another alternative embodiment can provide bit lines BLT0, BLTn, ..., BLF0, BLF that are initially pre-charged at a supply potential VDD while the node 12 can be placed at the ground. The transistors 14a, 14b of the first circuit portion 14 are in this case initially all on since when a word line is activated, certain transistors change conduction state and become off.

A particular embodiment when the first circuit portion 14 is formed of transistors 14a, 14b, of the NMOS type, provides to place these transistors in series each with a transistor of the same type mounted as a diode, in other words with its gate electrode and its drain connected in order to be able to deliver a stronger current.

Another way to adjust the duration of the aforementioned phase and in particular to delay and to lease the pre-charging element and in particular the transistor 19 active, once the word line is rendered active. In this case, a feedback loop is preferably provided in order to use the triggering signal to deactivate this transistor when the potential at the node 12 reaches the desired threshold value.

Another way to adjust the duration of the aforementioned phase leading to the emission of the signal $S_{eor}$ is to adapt the number of bit lines to which the triggering circuit 10 is connected.

A triggering circuit 10 according to the invention can be integrated into a memory device provided with an array plane divided into several arrays or group of SRAM memory cells, with each array or group of SRAM memory cells comprising local bit lines LBL connected to each one of the memory cells in the group of memory cells. Each array or group is also associated with one or several global bit lines GBL.

In the embodiment shown in FIG. 5A, a triggering circuit 10 is provided of the type of that described hereinabove associated with cell array and connected to local bit lines LBL.

Other triggering circuits of the same type can also be provided at the output respectively of other arrays (not shown). The end-of-read triggering signal $S_{eor}$ at the output of a triggering circuit 10 can be in this case transmitted to a multiplexer 60 of which inputs are connected respectively to the various outputs of the various triggering circuits and with each one able to deliver an end-of-read triggering signal.

Figure 5A:
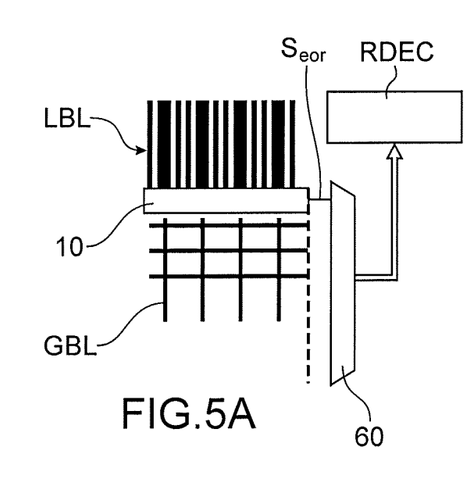
FIG. 5A shows an example of an implementation of a triggering circuit of the end of a read such as implemented according to the invention, connected to so-called "local" bit lines in an array plane provided with so-called "global" bit lines, the plane being shared into several groups or arrays with each one comprising its own "local" bit lines.
Figure 5B:
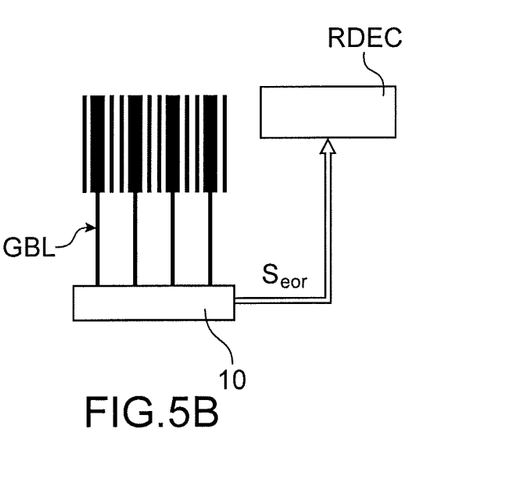
FIG. 5B shows another example of an implementation of a triggering circuit of the end of a read such as implemented according to the invention, connected to global bit lines of a SRAM array plane.

Another embodiment, shown in FIG. 5B, provide a triggering circuit 10 of the type of that described hereinabove connected to global bit lines GBL of an array plane divided into several matrices and provided with local bit lines and global bit lines.

A comparative simulation test was conducted between a first type of implementation corresponding to a device of the type of the one shown in FIG. 5A and comprising 128 local bit lines and 32 global bit lines for 32-bit words, and a second type of implementation corresponding to a device of the type of the one shown in FIG. 5B with global 32-bit lines for 32-bit words. The triggering circuit 10 is provided with identical dimensions from one implementation to the other in such a way that the parasite capacitances of this circuit are comparable between the two types of implementations.

The variance σT_EOR of the duration T_EOR of the phase resulting in the emission of the end-of-read signal, for the same total discharging time T_BL of the bit lines BL, is twice as low, for example about 0.6 ns, for the first type of implementation as than for the second type of implementation. The duration T_EOR is also lower for the first type of implementation. Indeed, for the first type of implementation, the triggering circuit takes account of a higher number of bit lines.

A SRAM memory device such as described hereinabove and provided with a triggering circuit that makes it possible to optimise the triggering of an end-of-read operation can advantageously be provided with an internal error correction code (ECC) circuit.

According to a particular embodiment, a circuit for triggering the end of the read operation such as mentioned hereinabove can be associated with a circuit structure provided with dummy bit lines connected to columns of dummy cells and also making it possible to trigger the end-of-read operation.

It can be provided to select, for example by the intermediary of a pin external to the memory device or via a selection circuit internal to the memory device, the circuit for triggering the end-of-read operation according to the invention or the one using a dummy column. Such a circuit using a dummy column is described for example in the document "Low Power and Reliable SRAM Memory Cell and Array Design", by Ishibashi et al, Springer Series in Advanced Micro-electronics, 2011.

The selection can be made according to the level of supply voltage used. It can for example be provided to select the end-of-read triggering circuit such as implemented according to the invention when the supply voltage belongs to a first range of supply voltage and to select the triggering circuit with a dummy column when the supply voltage used is higher than those of the first range.

The invention claimed is:

1. A static random access memory device comprising:
   an array plane of at least one array of SRAM memory cells, said at least one array of SRAM memory cells being associated with a plurality of pairs of bit lines and with a plurality of word lines,
   a circuit for triggering an end of a read operation, configured to emit an end-of-reading triggering signal for triggering the end of the read operation indicating the end of a given phase of a read operation carried out on the memory device, with this given phase being itself triggered by an activation, during a read operation, of a given word line among said plurality of word lines, said circuit for triggering the end of the read operation comprising:
   a plurality of pairs of transistors, each pair of transistors having a first transistor of which the gate is connected to a first bit line and a second transistor of which the gate is connected to a second bit line, complementary to the first bit line, each of the transistors of said pairs of transistors having a source connected to a node, said node and said first and second bit lines being, prior to an activation of said given word line, respectively pre-charged by pre-charging circuitry in such a way that the first and second transistors are in a given conduction state, then, when said word line is activated, said first and second bit lines are disconnected from the pre-charging circuitry, in such a way as to modify the given conduction state of certain transistors of said pairs of transistors and consequently cause a variation in a potential of said node until reaching a determined threshold potential that triggers an emission of an end-of-phase signal, the end-of phase signal configured to trigger an activation of at least one sense amplifier connected to said first and second bit lines.

2. The static random access memory device according to claim 1, wherein the first transistor and the second transistor are transistors of same type.

3. The static random access memory device according to claim 2, wherein the first transistor and the second transistor are transistors of identical design.

4. The static random access memory device according to claim 1, wherein the first transistor and the second transistor are transistors of the PMOS type, wherein the bit lines are, prior to the activation of said given word line, pre-charged to a supply potential VDD, a node of a detection circuit being pre-charged to a ground potential GND.

5. The static random access memory device according to claim 1, wherein the node is connected to a circuit portion adapted to slow down said variation in potential of said node.

6. The static random access memory device according to claim 5, wherein said circuit portion comprises at least one transistor of a type opposite the first transistor and opposite the second transistor.

7. The static random access memory device according to claim 5, wherein said circuit portion comprises a pre-charging element provided with one or several transistors, the pre-charging element being configured to apply to the node a pre-charge potential prior to the activation of said given word line.

8. The static random access memory device according to claim 5, wherein the circuit portion adapted to slow down said variation in potential of said node comprises at least one of a metal line and at least one capacitor.

9. The static random access memory device according to claim 5, wherein the circuit portion adapted to slow down said variation in potential of said node comprises at least one NMOS type transistor when the first transistor and the second transistor are PMOS type transistors.

10. The static random access memory device according to claim 1, wherein the node is connected to a circuit element configured to emit said end-of-reading triggering signal when the threshold potential is reached or exceeded.

11. The static random access memory device according to claim 10, wherein the circuit element connected to the node is a comparator.

12. The static random access memory device according to claim 10, wherein the circuit element connected to the node is an inverter.

13. The static random access memory device according to claim 1, wherein an output of the for triggering is connected to a control circuit adapted to emit an activation signal of said sense amplifier consecutive to the receiving of said end-of-reading triggering signal.

14. The static random access memory device according to claim 1, wherein an output of the circuit for triggering is connected to a line decoder configured to emit a word line deactivation signal consecutive to the receiving of said end-of-reading triggering signal.

15. The static random access memory device according to claim 1, wherein said first and second bit lines are local bit lines shared by cells of said at least one array of SRAM memory cells, the array plane comprising at least one other SRAM cell array, the device further comprising:
   another circuit for triggering the end of the read operation, configured to emit another signal for triggering the end of the read operation, said another circuit for triggering circuit being connected to other pairs of local bit lines shared by SRAM cells of said at least one other SRAM cell array,
a multiplexer at the output of said circuit for triggering the end of the read operation and of said another circuit for triggering the end of the read operation.

16. The static random access memory device according to claim 1, wherein the at least one array of SRAM memory cells is powered by a low supply voltage VDD.

17. A method for configuring a device according to claim 1, wherein the transistors of said pairs of transistors have a channel region provided in a biased substrate according to a given substrate biasing, the method comprising, after production or manufacturing of said triggering circuit, steps of:
carrying out a read operation on said memory array then, measuring the duration of said given phase during this read operation, and
scaling the given substrate biasing according to said measured duration.

18. The static random access memory device according to claim 1, wherein the at least one array of SRAM memory cells is powered according to a type of mode, in which the memory device is.

19. The static random access memory device according to claim 1, wherein the type of mode in which the memory device is comprises at least one of reading, writing and retaining.

* * * * *